United States Patent [19]
Yamashita

[11] Patent Number: 4,910,735
[45] Date of Patent: Mar. 20, 1990

[54] SEMICONDUCTOR INTEGRATED CIRCUIT WITH SELF-TESTING

[75] Inventor: Koichi Yamashita, Kawasaki, Japan

[73] Assignee: Fujitsu Limited, Kawasaki, Japan

[21] Appl. No.: 134,070

[22] Filed: Dec. 17, 1987

[30] Foreign Application Priority Data

Dec. 17, 1986 [JP] Japan .................... 61-302112

[51] Int. Cl.⁴ ............................................. G01R 31/28
[52] U.S. Cl. ................................. 371/22.4; 371/22.1
[58] Field of Search ............... 371/15, 25, 22.4, 22.1; 324/73 R, 73 AT, 73 PC

[56] References Cited

U.S. PATENT DOCUMENTS

| | | | |
|---|---|---|---|
| 4,598,401 | 7/1986 | Whelan | 371/25 |
| 4,670,877 | 6/1987 | Nishibe | 371/15 |
| 4,682,329 | 7/1987 | Kluth et al. | 371/15 |
| 4,701,921 | 10/1987 | Powell et al. | 371/25 |
| 4,710,930 | 12/1987 | Hatayama et al. | 371/25 |
| 4,764,926 | 8/1988 | Knight et al. | 371/25 |

OTHER PUBLICATIONS

Richard O. Carlson, et al, "Future Trends in Wafer Scale Integration", Proceedings of the IEEE, vol. 74, No. 12, pp. 1741-1751, 1986.

E. J. McCluskey, "Testing Semi-Custom Logic", Semiconductor International, pp. 118-123, Sep., 1985.

Primary Examiner—Charles E. Atkinson
Attorney, Agent, or Firm—Staas & Halsey

[57] ABSTRACT

A semiconductor integrated circuit comprises a plurality of integrated circuit blocks constructed on a wafer. The integrated circuit blocks are electrically connected to each other so as to form a system. Each of the integrated circuit blocks comprises a logic circuit for carrying out a logic operation, a pseudo-random pattern generating circuit for generating a pseudo-random pattern signal, a switching circuit for selecting either an input signal to be processed by the logic circuit or the pseudo-random pattern signal and a data compressing circuit for compressing an output data signal of the logic circuit. The switching circuit is responsive to a test enabling signal which is independently applied to each integrated circuit block so that each integrated circuit block is independently set to either a test mode or a normal mode, and outputs the selected signal to the logic circuit.

12 Claims, 7 Drawing Sheets

SEMICONDUCTOR INTEGRATED CIRCUIT WITH SELF-TESTING

BACKGROUND OF THE INVENTION

The present invention generally relates to a semiconductor integrated circuit, and in particular to a semiconductor integrated circuit constructed by systematically combining a plurality of integrated circuits formed on a wafer, each having a self-testing function.

Recently, wafer-scale semiconductor integrated circuits have been developed and fabricated. A wafer-scale integrated circuit is defined as an integrated circuit formed by the entire wafer or an integrated circuit having similar scale to an integrated circuit using the whole of one wafer. The wafer-scale integrated circuit is large in scale, as compared with conventional chip-scale semiconductor integrated circuit. For example, a wafer of an order of about 3 to 6 inches is used for the wafer-scale integrated circuit. In addition, the wafer-scale integrated circuit has more input/output terminals (300–1000 in general) than the conventional integrated circuits.

The wafer-scale integrated circuit includes a plurality of integrated circuit blocks. An integrated circuit block is defined as an integrated circuit for carrying out logical operations. This means that the intgrated circuit block includes an adder, a multiplier or a multiplier accumulator or an arbitrary combination thereof in digital form. For example, each of the integrated circuit blocks can form a butterfly computation processor. The integrated circuit blocks may be arbitrarily combined with other circuit blocks on the same wafer, so that a logical operating system can be obtained. For example, a four point fast Fourier transform processor may be configured by coupling 4 integrated circuit blocks each having the function of butterfly computation.

As in the case of conventional semiconductor integrated circuits, it is necessary to test the operation of the wafer-scale integrated circuit. An integrated circuit (abbreviated as IC) tester is used for testing the chip-scale semiconductor integrated circuits. The IC tester has probes supported by probe guards for checking operation of the integrated circuit in a waer state where the integrated circuit has not yet been packaged. Upon the operation test, the probes come in contact with pads mounted on the wafer. However, the IC tester is not suitable for testing the wafer-scale integrated circuit because it is difficult to keep pressure against the probes uniform and to precisely position the probes with respect to the corresponding pads. In addition, the currently available IC tester has 256 input/output terminals at maximum.

Also, a board tester is used for printed circuit boards. The currently available board tester has 1024 input/output terminals at maximum. However, since contact with the pads on the board is made by use of edge connectors, the board tester cannot be used for testing the wafer-scale integrated circuit.

From the point of view mentioned above, conventionally, self-testing circuits are built in the wafer-scale integrated circuit. In detail, one integrated circuit block is provided with one self-testing circuit. By the self-testing circuits, each integrated circuit can be tested. It should be noted that testing only each individual integrated circuit block is not enough to check operation of the wafer-scale integrated circuit. This is because some integrated circuit blocks are combined to form a logic system. In other words, in order to check the wafer-scale semiconductor circuit more completely, it is also necessary to test the logical operation system in addition to the individual integrated circuit blocks.

In the conventional wafer-scale integrated circuits, a self-testing circuit for testing the system is added to the systematically constructed integrated circuits. The self-testing circuit for the system test is mounted on the wafer. That is, a particular region of the wafer is necessary for mounting the self-testing circuit. This causes a decrease in the integration density of the wafer-scale semiconductor device.

SUMMARY OF THE INVENTION

Accordingly, a general object of the present invention is to provide a novel and useful semiconductor integrated circuit in which the disadvantages of the conventional wafer-scale semiconductor integrated circuit are eliminated.

A more specific object of the present invention is to provide a semiconductor integrated circuit in which a logic system of integrated circuit blocks can be tested by use of built in self-testing circuits of the integrated circuit blocks.

Another object of the present invention is to provide a semiconductor integrated circuit in which the integration density can be improved.

The above objects of the present invention are accomplished by providing a semiconductor integrated circuit comprising a plurality of integrated circuit blocks constructed on a wafer, the integrated circuit blocks being arbitrarily electrically connected to each other so as to form a system. Each of the integrated circuit blocks comprises a logic circuit for carrying out a logic operation; a pseudo-random pattern generating circuit for generating a pseudo-random pattern signal; a switching circuit for selecting either an input signal to be processed by the logic circuit or the pseudo-random pattern signal in response to a test enabling signal independently applied to each integrated circuit block so that each integrated circuit block is independently set to either a test mode or a normal mode, and for outputting the selected signal to the logic circuit; and a data compressing circuit for compressing an output data signal of the logic circuit.

Other objects and features of the present invention will become apparent from the following detailed description when read in conjunction with the attached drawings.

BRIEF DESCRIPTION OF THE DRAWINGS

FIGS. 2(A) through 2(C) are timing charts of signals used in the block structure shown in FIG. 1;

DESCRIPTION OF THE PREFERRED EMBODIMENT

A description will first be given on a conventional wafer-scale integrated circuit for a better understanding of the present invention.

Figures 1, 2:
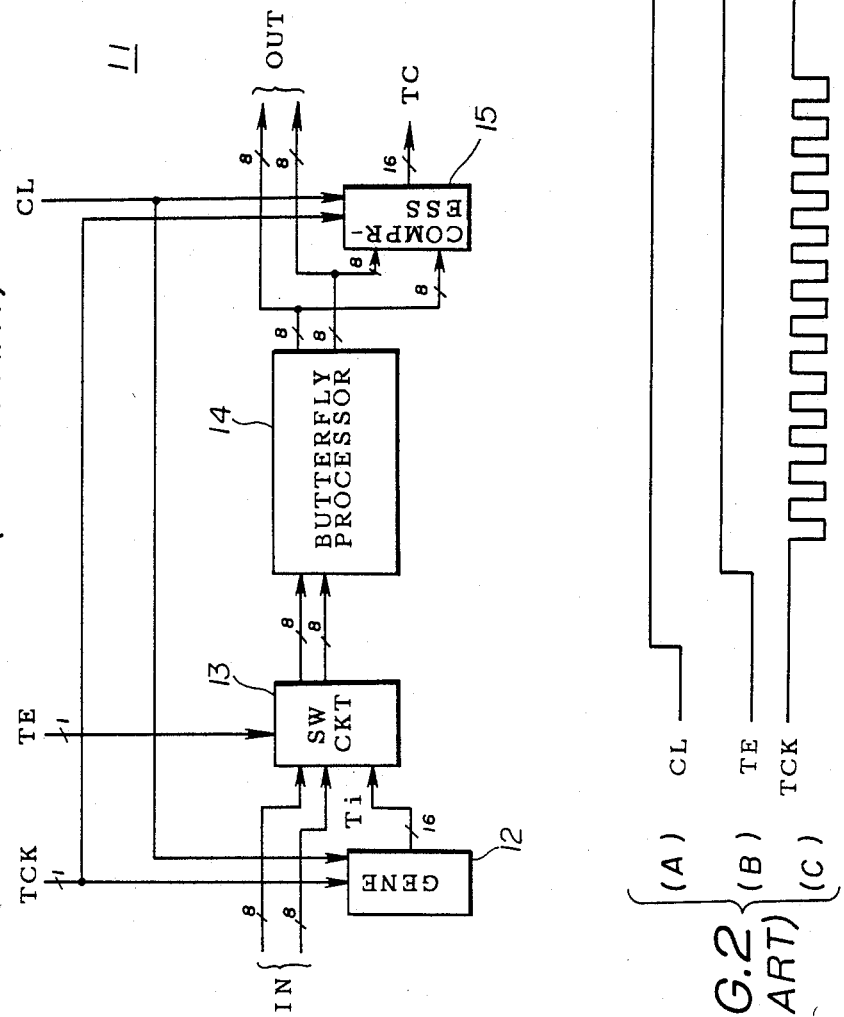
FIG. 1 is a block diagram of an integrated circuit block of a conventional semiconductor integrated circuit.

FIG. 1 is a block diagram of an example of one integrated circuit block of a conventional wafer-scale integrated circuit. An integrated circuit block 11 is composed of a pseudo-random pattern generator 12, a switching circuit 13, a butterfly processor 14 and a data compressor 15. The pseudo-random pattern generator 12 and the data compressor 15 comprise a self-testing circuit for the block 11. The pseudo-random pattern generator 12 generates a pseudo-random pattern Ti for testing the integrated circuit block 11 by use of a clock signal TCK for tests. In this exammple, the pseudo-random pattern is made up of 16 bits. The generator 12 is cleared by the clear signal CL. The switching circuit 13 selects either two 8-bit input signals from an integrated circuit block preceding block 11 (or an external circuit) or the output signal from the generator 12 in response to a test enabling signal TE. The butterfly processor 14 has a pair of 8-bit input lines and a pair of 8-bit output lines and executes a butterfly computation. Output signals of the butterfly processor are fed to following integrated circuit blocks or an external circuit. Also, the output signals of the butterfly processor 14 are fed to the data compressor 15, which compresses the received signals and produces a compressed data (a signature output) TC of 16 bits in synchronization with the test clock signal TCK. The compressed data is output to the external cricuit. The data compressor 15 is cleared in response to the clear signal CL.

A description will be given of the self-test of the integrated circuit block, by referring to FIG. 2.

First of all, the clear signal CL and the test enabling signal TE produced by a testing circuit (not shown) are set to a high level as shown in FIGS. 2(A) and 2(B), respectively. Then, the pseudo-random pattern generator 12 and the data compressor 15 are initially set, and the switching circuit 13 selects the output signal Ti of the generator 12. Then, the test clock signal TCK shown in FIG. 2(C) is supplied to the pseudo-random pattern generator 12 and the data compressor 15. The pseudo-random pattern is passed through the switching circuit 13 and fed to the butterfly processor 14, the output of which is supplied to the data compressor 15. Then, the compressed data (the signature output) from the data compressor 15 is compared with an expected value data by the test device. If the integrated circuit block is non-defective, both the data are identical to each other. In the same way, the other integrated circuit blocks can be tested.

Integrated circuit blocks which are not defective integrated circuit blocks may be electrically coupled so as to construct a desired system. As described before, the system composed of the integrated circuit blocks must be tested to check whether or not the system is defective. For this purpose, a self-testing circuit for the system test is added to the conventional wafer-scale integrated circuits.

Figure 3A:
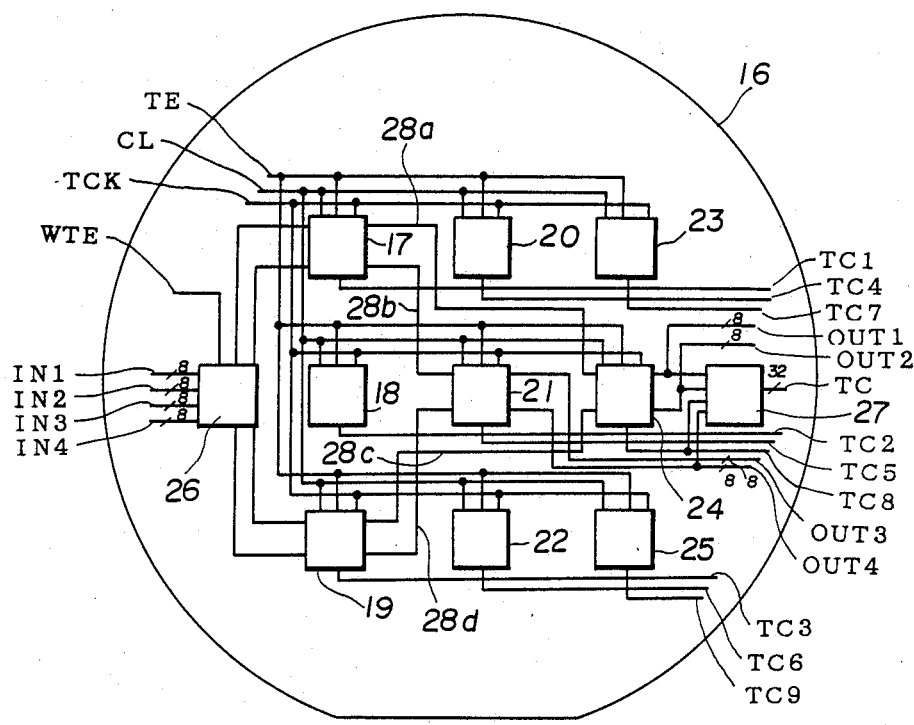
FIG. 3A is a block diagram of a conventional semiconductor integrated circuit in which a system is constructed by the combination of a plurality of integrated circuit blocks each having the configuration shown in FIG. 1.

FIG. 3A is a block diagram of a conventional semiconductor integrated circuit at the wafer scale integrated circuit having a self-testing circuit for the system test. Integrated circuit blocks 17 to 25 each having the structure shown in FIG. 1 are formed on a wafer 16. In this configuration, it is assumed that the integrated circuit blocks 17, 19, 21 and 24 are non-defective and the other blocks are defective. The non-defective integrated circuit blocks are electrically connected by signal lines 28a, 28b, 28c and 28d, as shown in FIG. 3A, and thus a system for a 4-point fast Fourier transform (hereafter referred to as FFT) processor is constructed. The test enabling signal TE, the clear signal CL and the test clock signal TCK are commonly supplied to the integrated circuit blocks 17 to 25. TC1 to TC9 denote compressed data from the corresponding integrated circuit blocks.

Figure 3B:
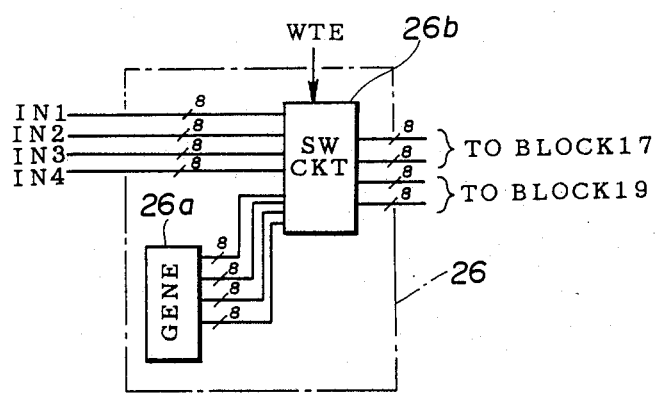
FIG. 3B is a block diagram of a pseudo-random pattern generator 26 shown in FIG. 3A for a system test.

A block 26 denotes a pseudo-random pattern generator which is added to the system in order to test the operation of the FFT processor composed of the blocks 17, 19, 21 and 24. A detailed configuration of the pseudo-random pattern generator 26 is illustrated in FIG. 3B. The generator 26 consists of a pseudo-random pattern generator 26a and a switching circuit 26b for selecting either four 8-bit input signals IN1 to IN4 or four 8-bit pseudo-random pattern signals in response to a wafer test enabling signal WTE. Out of the selected four 8-bit signals, two signals are fed to the integrated circuit block 17, and the other two signals are fed to the integrated circuit block 19. A block 2 (FIG. 3A) denotes a data compressor for checking operation of the FFT processor.

At the time of testing the system, the pseudo-random pattern signal of 32 bits is passed through the switching circuit 26b, and a first 16 bit pseudo-random pattern signal is fed to the block 17, and a second other 16 bit pseudo-random pattern signal is fed to the block 19. In each of the blocks 17 and 19, the pseudo-random pattern signal is passed through the switching circuit 13, and fed to the butterfly processor 14. One 8-bit output signal of the butterfly processor 14 of the block 17 is fed to the block 24 and the other 8-bit output signal is fed to the block 21. Similarly, one 8-bit output signal of the butterfly processor 14 of the block 19 is fed to the block 24 and the other 8-bit output signal is fed to the block 21. These output signals are processed in the blocks 21 and 24 in the same way. Then, output signals OUT1 and OUT2 of the block 24 and output signals OUT3 and OUT4 of the block 21 are compared with an expected value data for the system test. If the output signals of the blocks 21 and 24 coincide with the expected value data, it is found that the FFT processor is non-defective.

However, as described in the foregoing, the presence of the self-testing circuit for the system test consisting of the added pseudo-random pattern generator 26 and the added data compressor 27 causes a decrease in the integration density of the semiconductor device.

The present invention is mainly intended to carry out the system test by using the self-testing circuits built-in the integrated circuit blocks to eliminate the above problem.

A description will be given of an embodiment of the present invention, by referring to FIGS. 4 through 10.

Figure 4:
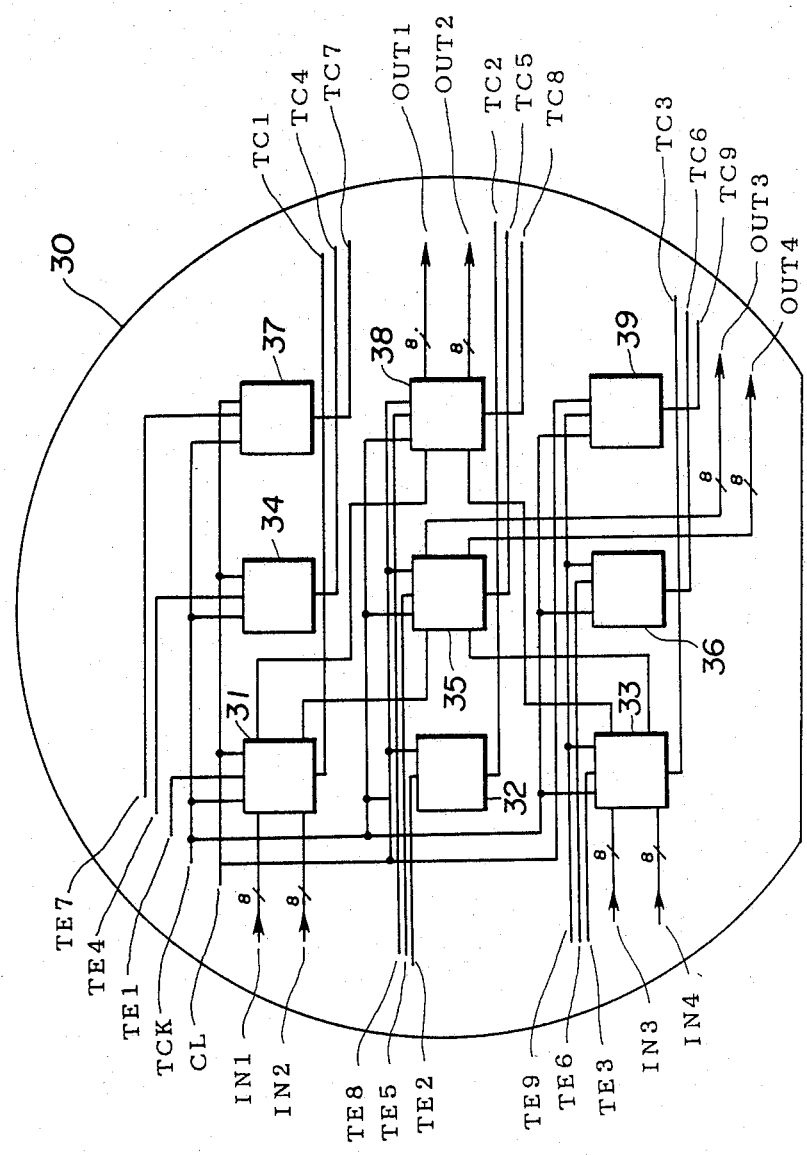
FIG. 4 is a block diagram of an example of a semiconductor integrated circuit according to the present invention in which a system is constructed by a plurality of integrated circuit blocks.

Referring to FIG. 4, a wafer scale integrated circuit of the preferred embodiment includes nine integrated circuit blocks 31 to 39 which are formed on a wafer 30. Metal oxide semiconductor or bipolar transistor or other conventional schemes may be utilized for fabrication of the illustrated circuit device. Each block has a self-testing circuit for checking whether or not the block is defective. In the following description, it is assumed that the blocks 31, 33, 35 and 38 have been found to be non-defective by the self-testing circuits built-in the blocks 31 to 39. Therefore, the blocks 31, 33, 35 and 38 are electrically connected as shown in FIG.4 and a system is configured.

Figure 5:
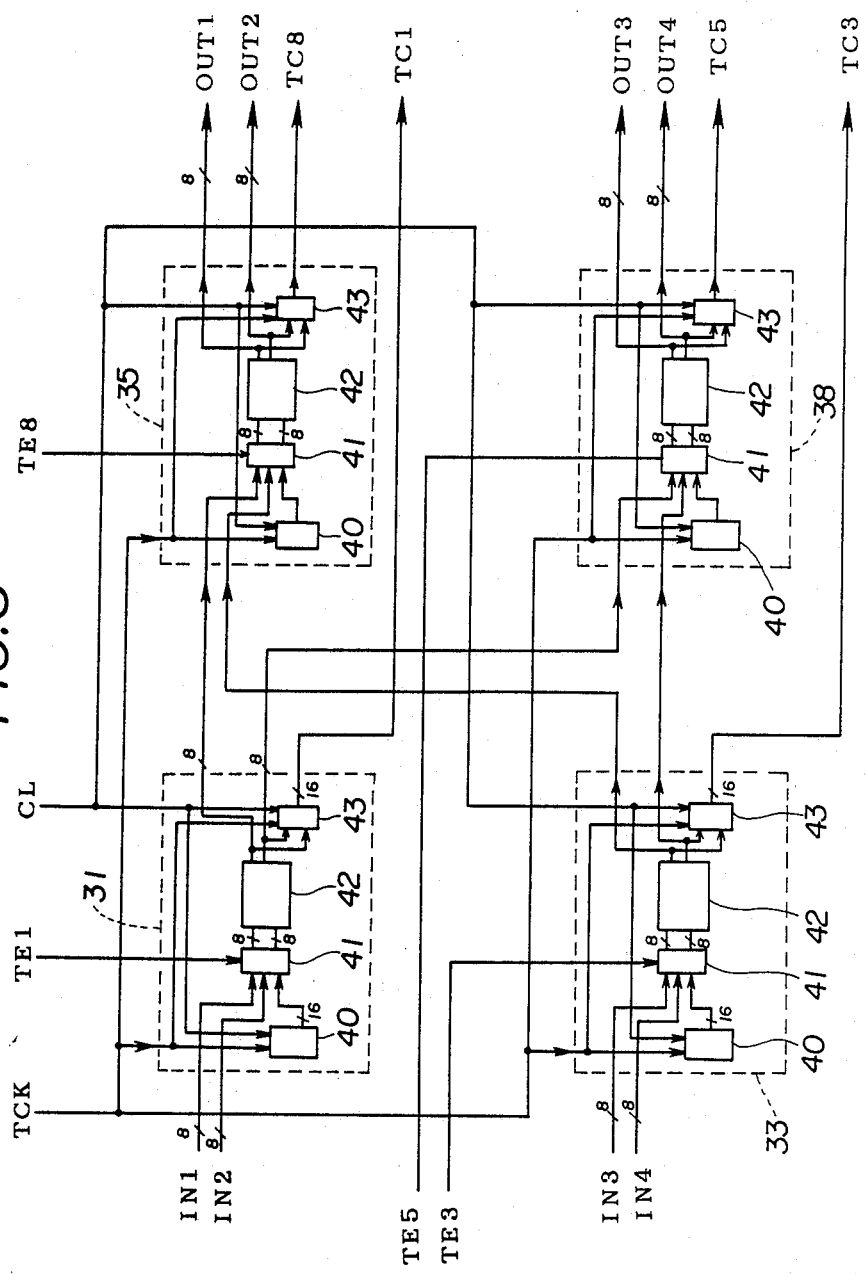
FIG. 5 is a detailed block diagram of the system shown in FIG. 4.

FIG. 5 shows a detailed configuration of the system consisting of the blocks 31, 33, 35 and 38. For example, the integrated circuit block 31 is composed of a pseudo-random pattern generator 40, a switching circuit 41, a butterfly processor 42 and a data compressor 43. The other integrated circuit blocks are of the same structure as the block 31. The pseudo-random pattern generator 40, the butterfly processor 42 and the data compressor 42 are similar to the generator 12, the processor 14 and the compressor 15 shown in FIG. 1, respectively.

A difference between the configuration of the block of the embodiment and the configuration of the conventional block in FIG. 1 is as follows. The switching circuit 13 of each integrated circuit block in the conventional circuit is commonly controlled by the test enabling signal TE. In other words, at the time of testing each block, the switching circuit 13 of each block selects the output signal of the pseudo-random pattern generator 12. On the other hand, the switching circuit 41 of each block of the preferred embodiment is independently controlled by corresponding test enabling signals TE1 to TE9.

The signals CL, TE1 to TE9 and IN1 to IN4 are supplied to the corresponding blocks through input terminals (not shown) by a test device (not shown). The signals TC1 to TC9, OUT1 to OUT4 are fed to the test device through output terminals (not shown).

The test of the integrated circuit blocks is carried out in a similar way to that for the conventional circuit. That is, the pseudo-random pattern generator 40 and the data compressor 43 of each block are initially set in response to the clear signal CL of the high level. The test enabling signals TE1 to TE9 of the high level are supplied to the integrated circuit blocks 31 to 39, respectively. The compressed data of each block is output through output terminals (not shown) and compared with the expected value data by the test device. If both the data are identical to each other, the integrated circuit block is non-defective.

Integrated circuit blocks which are not defective integrated circuit blocks are electrically coupled so as to construct a desired system. As described before, the blocks 31, 33, 35 and 38 are assumed to be non-defective and are electrically coupled as shown in FIG. 1. Thus, one system of the 4-point FFT processor is configured. Connection of the blocks may be made by means of various conventional methods. For example, a metallization layer can be deposited on a top surface of the chip. Another means for the connection is exposure open amorphous silicon layer sandwiched between the different level interconnecton layers by a laser beam.

Thereafter, the test of the 4-point FFT processor composed of the blocks 31, 33, 35 and 38 is carried out as follows. Operation of the embodiment upon this test is described below, by referring to FIG. 6.

First, the clear signal CL is set to the high level as shown in FIG.6(A) and is fed to the integrated circuit blocks 31, 33, 35 and 38, and the pseudo-random pattern generator 42 and the data compressor 43 in each block are initially set.

Then, the test enabling signals TE1 and TE3 are set to high level as shown in FIG.6(B) and are supplied to the blocks 31 and 33, respectively, which are positioned at the top (first stage) of the system, so that the blocks 31 and 33 are set to a test mode. In contrast, the test enabling signals TE5 and TE8 of the low level as shown in FIG. 6(C) are supplied to the blocks 35 and 38 following the blocks 31 and 33, so that the blocks 35 and 38 are set to a normal operating mode. That is, the output signals of the blocks 31 and 33 are passed through the switching circuits 41 and fed to the butterfly processors 42 in the blocks 35 and 38. Then, the output signals of the processors 42 are fed to the data compressors 43. Even when the blocks 35 and 38 are in the normal operating mode, the genrator 40 and the compressor 43 are active.

Next, the test clock signal TCK is activated as shown in FIG.6(D). Then, the pseudo-random pattern generator 40 and the data compressor 43 of each block start to operate. Since the blocks 31 and 33 are maintained in the test mode, the pseudo-random pattern signals from the generators 40 thereof are passed through the switching circuits 41 and fed to the butterfly processors 42. The output signals of the buttery processors 42 of the blocks 31 and 33 are fed to the integrated circuit blocks 35 and 38. The signals from the blocks 31 and 33 are passed through the switching circuits 41 of the blocks 35 and 38, respectively, and fed to the butterly processors 42 thereof. Then, the output signals of the processors 42 of the blocks 35 and 38 are delivered to the data compressors 43 thereof, so that the compressed data (signature outputs) TC5 and TC8 are outputted through the output terminals (not shown) to the test device.

After a predetermined period of the test clock signal TCK applied to the system, the compressed data derived from the blocks 35 and 38 are compared with an expected value data. If the system is not defective, both the data are identical to each other. In this way, it is possible to check the operation of the system by using the self-testing circuits each composed of the pseudo-random pattern generator and the data compressor built-in the integrated circuit blocks. Therefore, the additional self-testing circuit for the system test provided on the wafer is no longer necessary to check the operation of the system.

Figure 7:
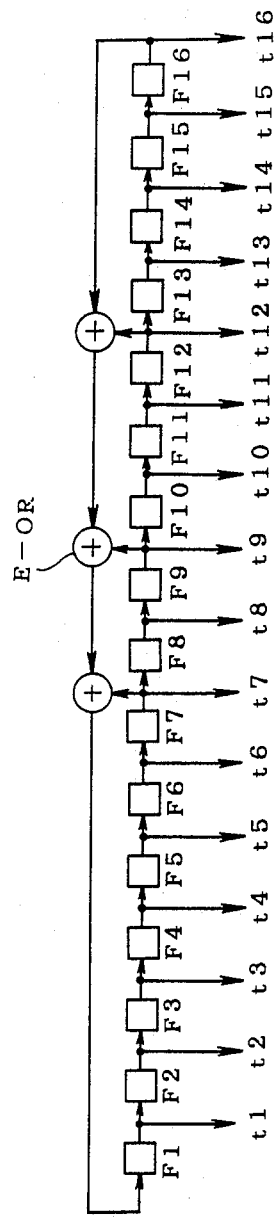
FIG. 7 is a circuit diagram of a pseudo-random pattern generator shown in FIG. 5.

FIG. 7 is a circuit diagram of the pseudo-random pattern generator 40 shown in FIG. 5. As shown, the generator 40 consists of 15 delay flip-flop circuits F1 to F15 with clear terminals, 1 delayed flip-flop F16 with a set terminal, and 3 exclusive-OR circuits E-OR. For simplicity, the test clock signal TCK and the clear signal CL are not illustrated. The pseudo-random pattern of 16 bits t1 to t16 is obtained at the output terminals of the flip-flop circuits F1 to F16. The structure shown in FIG. 7 is so-called a linear feedback shift register producing a cyclic redundancy check signal.

Figure 8:
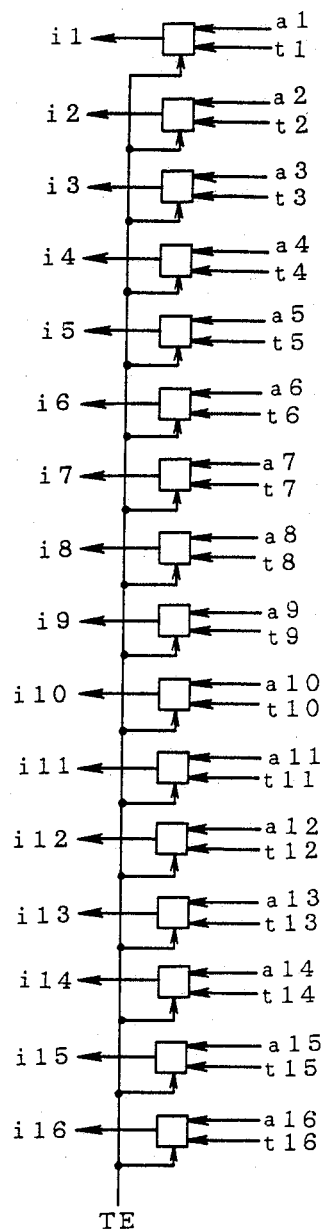
FIG. 8 is a circuit diagram of a switching circuit shown in FIG. 5.

FIG. 8 is a detailed block diagram of the switching circuit 41. The switching circuit 41 is composed of sixteen 1-bit switching circuits illustrated with rectangular blocks. Symbols a1 to a16 denote bits of the input signals. Output bits of the swiching circuit 41 are represented by i1 to i16.

Figure 9:
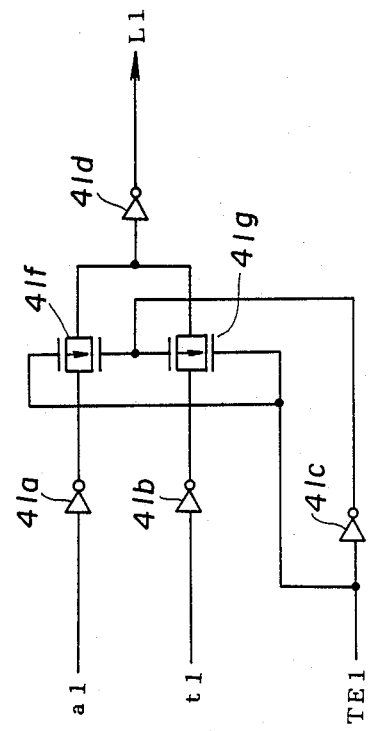
FIG. 9 is a circuit diagram of a 1-bit switching circuit of the switching circuit shown in FIG. 8.
Figure 6:
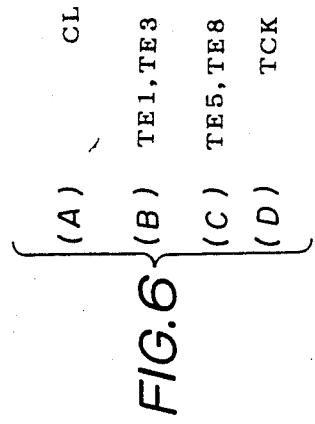
FIGS. 6(A) through 6(D) are timing charts of signals used in the configuration shown in FIGS. 4 and 5.

FIG. 9 is a circuit diagram of a one 1-bit switching circuit. The 1-bit input signal a1 and 1-bit pattern signal t1 are inverted by inverters 41a and 41b and fed to transmission gates 41f and 41g, respectively. The transmission gates 41f and 41g are controlled by both the test enabling signal TE1 and an inverted test enabling signal. When one of the gates is in a closed state, the other is in an open state. The output signals of the gates 41f and 41g are inverted by an inverter 41d and fed to the butterfly processor 42.

Figure 10:
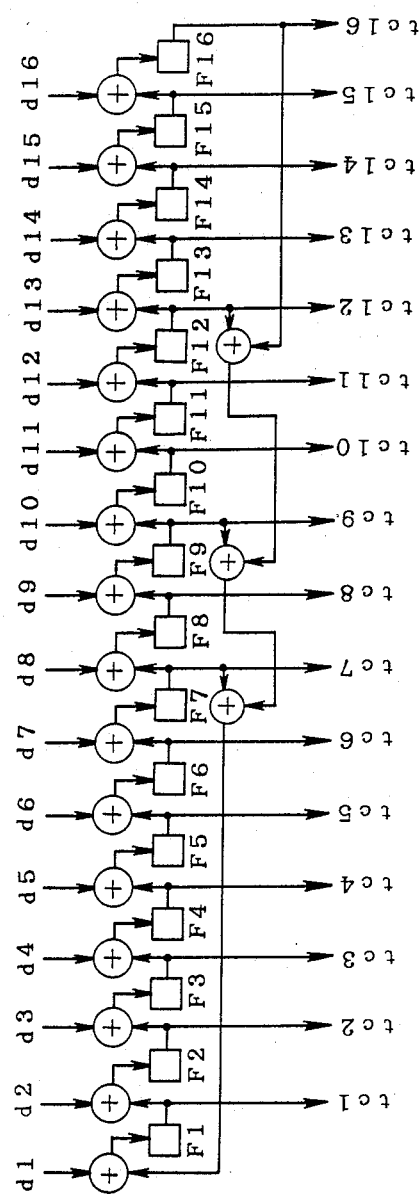
FIG. 10 is a circuit diagram of a data compressor shown in FIG. 5.

FIG. 10 is a circuit diagram of the data compressor 43. As illustrated, the data compressor 43 consists of 16 delayed flip-flop circuits F1 to F16 with clear terminals and 19 exclusive-OR circuits E-OR. For simplicity, the test clock signal TCK and the clear signal CL are not shown. Symbols tc1 to tc16 denote bits of the compressed data.

The present invention is not limited to the embodiment described in the foregoing, but various variations and modifications may be made without departing the scope of the present invention. For example, the present invention is not limited to the butterfly processor. Any logical operation for the integrated circuit block is applicable. The system may be constructed with combinations of the same kind of the integrated circuit blocks or different kinds of the integrated circuit blocks. Moreover, even when a plurality of systems are constructed in the semiconductor integrated circuit, these systems may be tested in the same manner as that described in the foregoing.

What is claimed is:

1. A semiconductor integrated circuit comprising:
   integrated circuit blocks connected in series for testing a system formed on said semiconductor integrated circuit, the system having a first stage and a following stage each including at least one of said integrated circuit blocks, each of said integrated circuit blocks comprising:
   logic means for carrying out a logic operation and providing output data signals corresponding thereto;
   an input terminal receiving input signals supplied to the integrated circuit blocks;
   pseudo-random pattern generating means for generating a pseudo-random pattern signal;
   data compressing means for receiving and compressing the output data signals supplied from said logic means to generate a compressed data signal; and
   an output terminal, operatively connected to said logic means, for receiving the output data signal from said logic means and for directly supplying the same to said input terminal of the integrated circuit blocks corresponding to the following stage,
   wherein at least one of said integrated circuit blocks of the first stage include first switching means for connecting said pseudo-random pattern generating means thereof to said logic means thereof during testing of the system, and
   wherein each of said integrated circuit blocks of the following stage include second switching means for connecting said input terminal thereof to said logic means thereof during testing of the system.

2. A circuit as recited in claim 1, wherein said semiconductor integrated circuit is a wafer-scale semiconductor integrated circuit, and said integrated circuit blocks comprise a wafer.

3. A circuit as recited in claim 1, wherein said logic means comprises a butterfly processor operatively connected to said input terminal thereof and said pseudo-random pattern generating means thereof.

4. A circuit as recited in claim 1, wherein said integrated circuit blocks of said semiconductor integrated circuit comprise a fast Fourier transform processor.

5. A circuit as recited in claim 1, wherein at least one of said integrated circuit blocks form a final stage, and the compressed data signal generated by said data compressing means of the at least one of said integrated circuit blocks of the final stage are used for determining whether said semiconductor integrated circuit operates correctly.

6. A circuit as recited in claim 1, wherein said semiconductor integrated circuit receives a plurality of test enable signals from an external circuit, and each of said first and second switching means comprises a test enable terminal for receiving one of the test enable signals.

7. A circuit as recited in claim 1, wherein said semiconductor integrated circuit operates in one of a test mode and a normal mode, and during the normal mode said first switching means corresponding to the at least one of said integrated circuit blocks of the first stage connects said input terminal thereof to said logic means thereof.

8. A circuit as recited claim 1, wherein said semiconductor integrated circuit operates in one of a test mode and a normal mode, and during the normal mode said second switching means corresponding to each of said integrated circuit blocks of the following stage connects said input terminal thereof to said logic means thereof.

9. A circuit as recited in claim 8, wherein during the normal mode said first switching means corresponding to the at least one of said integrated circuit blocks of the first stage connects said input terminal thereof to said logic means thereof.

10. A circuit as recited in claim 1, wherein said pseudorandom pattern generating means comprises a linear feedback shift register producing a cyclic redundancy check signal.

11. A wafer-scale integrated circuit for testing a complete system, said wafer-scale integrated circuit comprising logic blocks forming the complete system to be tested, each logic block including self-test means for testing said logic block corresponding thereto, said self-test means of at least one of said logic blocks is further for testing the complete system.

12. A circuit as recited in claim 11, wherein said logic blocks have an operational mode and a self-test mode, the complete system having a first stage and a following stage,
   wherein said wafer-scale integrated circuit further comprises means for providing test enable signals for independently switching each of said logic blocks between the self-test mode and the operational mode, and
   wherein during testing of the complete system at least one of said logic blocks in the first stage is switched into the self-test mode and at least one of said logic blocks in the following stage is switched into the operation mode.

* * * * *